(12) United States Patent
Kino

(10) Patent No.: US 7,292,307 B2
(45) Date of Patent: Nov. 6, 2007

(54) COOLING APPARATUS, OPTICAL ELEMENT HAVING THE SAME, AND EXPOSURE APPARATUS

(75) Inventor: Yoshiki Kino, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 79 days.

(21) Appl. No.: 10/776,717

(22) Filed: Feb. 11, 2004

(65) Prior Publication Data

US 2004/0227913 A1    Nov. 18, 2004

(30) Foreign Application Priority Data

Feb. 13, 2003  (JP) ............................. 2003-034956

(51) Int. Cl.
  *G03B 27/52*  (2006.01)
  *G03B 27/42*  (2006.01)
  *G02B 5/08*   (2006.01)

(52) U.S. Cl. ........................ 355/30; 355/53; 359/845

(58) Field of Classification Search .................. 355/30, 355/53, 67; 430/60; 359/845, 838
See application file for complete search history.

(56) References Cited

U.S. PATENT DOCUMENTS

| 4,253,739 | A | * | 3/1981 | Carlson | 359/845 |
|---|---|---|---|---|---|
| 4,657,359 | A | * | 4/1987 | Thompson et al. | 359/845 |
| 4,674,848 | A | * | 6/1987 | Aldrich et al. | 359/845 |
| 4,772,110 | A | * | 9/1988 | Roszhart | 359/845 |
| 4,844,603 | A | * | 7/1989 | Eitel et al. | 359/845 |
| 5,209,291 | A | * | 5/1993 | Taylor | 165/168 |
| 5,444,576 | A | * | 8/1995 | Shimada | 359/845 |
| 5,713,660 | A | * | 2/1998 | Mori et al. | 362/268 |
| 2001/0013925 | A1 | * | 8/2001 | Loopstra et al. | 355/30 |
| 2003/0035088 | A1 | * | 2/2003 | Emoto | 355/53 |
| 2004/0051984 | A1 |   | 3/2004 | Oshino et al. |   |
| 2005/0073663 | A1 | * | 4/2005 | Miyajima | 355/30 |
| 2005/0099611 | A1 | * | 5/2005 | Sogard | 355/30 |

FOREIGN PATENT DOCUMENTS

JP    11243052 A    9/1999

* cited by examiner

*Primary Examiner*—Alan Mathews
(74) *Attorney, Agent, or Firm*—Morgan & Finnegan, LLP

(57) ABSTRACT

A cooling apparatus for use with an optical element having a concave part includes a cooling mechanism, located in the concave part of the optical element, for cooling the optical element through radiation in a non-contact manner.

10 Claims, 13 Drawing Sheets

COOLING APPARATUS, OPTICAL ELEMENT HAVING THE SAME, AND EXPOSURE APPARATUS

This application claims a benefit of priority based on Japanese Patent Application No. 2003-034956, filed on Feb. 13, 2003, which is hereby incorporated by reference herein in its entirety as if fully set forth herein.

BACKGROUND OF THE INVENTION

The present invention relates to a cooling apparatus, and more particularly to a cooling apparatus for cooling an optical element in an exposure apparatus that exposes an object, such as a single crystal substrate and a glass plate for a liquid crystal display ("LCD"). The present invention is suitable, for example, for an exposure apparatus that uses ultraviolet ("UV") and extreme ultraviolet ("EUV") light as an exposure light source.

An EUV exposure apparatus has recently been being developed as a next generation exposure apparatus that uses EUV light with a wavelength between 5 and 20 nm, e.g., wavelengths 13 nm and 11 nm, to transfer a circuit pattern with a practically minimum critical dimension (or device rule) of 50 nm or smaller onto a substrate, such as a wafer, in a lithography for manufacturing semiconductor devices.

The EUV light has a wavelength less than 10% of that of the conventional UV light, such as mercury lamps and excimer laser, and is subject to strict optical requirements. Moreover, the EUV light cannot transmit through conventional glass materials, such as quartz and calcium fluoride, due to its wavelength characteristics, and is incompatible with the conventional transmission or refractive optical system. Therefore, the EUV lithography uses a mirror even for a mask. A film formed on the mirror mainly uses a coating multilayer made of molybdenum (Mo)/Silicon (Si), but this multilayer has different reflectance, such as about 70%, according to angles of incident light. The non-reflected light among the incident light is absorbed as a heat source in a mirror, and thermally deforms the mirror surface disadvantageously. The mirror uses a material having a small coefficient of linear expansion to reduce mirror's deformations caused by temperature changes. Since the EUV exposure apparatus is used to expose a circuit pattern of 0.1 μm or smaller and required to meet very high critical dimension accuracy, only a deformation of about 0.1 nm or smaller is permissible on the mirror surface. When the mirror has a coefficient of linear expansion of 10 ppb, the mirror surface deforms as the temperature rises and the mirror surface shape changes by 0.1 nm when the temperature rises by 0.2° C. Japanese Patent Application Publication No. 11-243052 has accordingly proposed, as one solution for this problem, a method that brings a Peltier element, a heat pipe, etc. into direct contact with the mirror and cools the mirror through heat conduction.

However, the direct contact of the Peltier element, a heat pipe, etc. with the mirror, proposed in Japanese Patent Application No. 11-243052, would possibly deform the mirror surface due to vibrations of fluid, etc. that is introduced into a cooling jacket. The heat pipe applies stress onto a direct contact portion on the mirror surface, and deforms the surface. As discussed, the deformed mirror is not preferable because it deteriorates the imaging performance and does not provide a desired critical dimension.

BRIEF SUMMARY OF THE INVENTION

Accordingly, it is an exemplified object of the present invention to provide a cooling apparatus that prevents or reduces a deformation of an optical element for desired optical performance, the optical element having the cooling apparatus, and an exposure apparatus that uses the optical element.

A cooling apparatus of one aspect according to the present invention for use with an optical element having a concave part includes a cooling mechanism, located in the concave part of the optical element, for cooling the optical element through radiation in a non-contact manner.

An optical element of another aspect according to the present invention includes a base having a surface to be illuminated by light, and a first concave part, and a cooling mechanism, located in the first concave part, for cooling said base through radiation in a non-contact manner. The surface may have an area to be illuminated, and the first concave part may be located opposite to the area on the surface. The cooling mechanism may include a radiation plate provided opposite to the base, and a Peltier element that cools the radiation plate. The cooling mechanism may have a channel for coolant to flow, and further includes a cooling jacket for recovering heat from the Peltier element. The cooling mechanism may further include a heat insulator for preventing the base from absorbing heat obtained by the first concave part. The base may have a second concave part provided at a position different from that of the first concave part in a non-illuminated area. The second concave part may be opposite to the non-illuminated area on the surface to be illuminated. An interval between the area to be illuminated and the first concave part may be made almost constant. The first concave part may have a shape that changes according to temperature distributions on the surface to be illuminated. The cooling mechanism may change cooling power based on a position according to temperature distributions on the surface to be illuminated. The optical element is, for example, a mirror. The optical element may further include a detector for detecting a temperature of said base, and a controller for controlling said cooling mechanism so that the temperature of said base detected by said detector becomes a predetermined value.

An optical element of another aspect according to the present invention includes a surface to be illuminated by light, said optical element having a concave part opposite to the surface.

An exposure apparatus comprising an optical system for exposing a pattern formed on a mask or a reticle onto an object, wherein the optical system includes the above optical element also constitutes one aspect according to the present invention.

A device fabricating method of another aspect of the present invention includes the steps of exposing an object using the above exposure apparatus, and developing the exposed object. Claims for a device fabricating method for performing operations similar to that of the above exposure apparatus cover devices as intermediate and final products. Such devices include semiconductor chips like an LSI and VLSI, CCDs, LCDs, magnetic sensors, thin film magnetic heads, and the like.

Other objects and further features of the present invention will become readily apparent from the following description of the preferred embodiments with reference to accompanying drawings.

DETAILED DESCRIPTION OF THE PREFERRED EMBODIMENTS

Figure 1A:
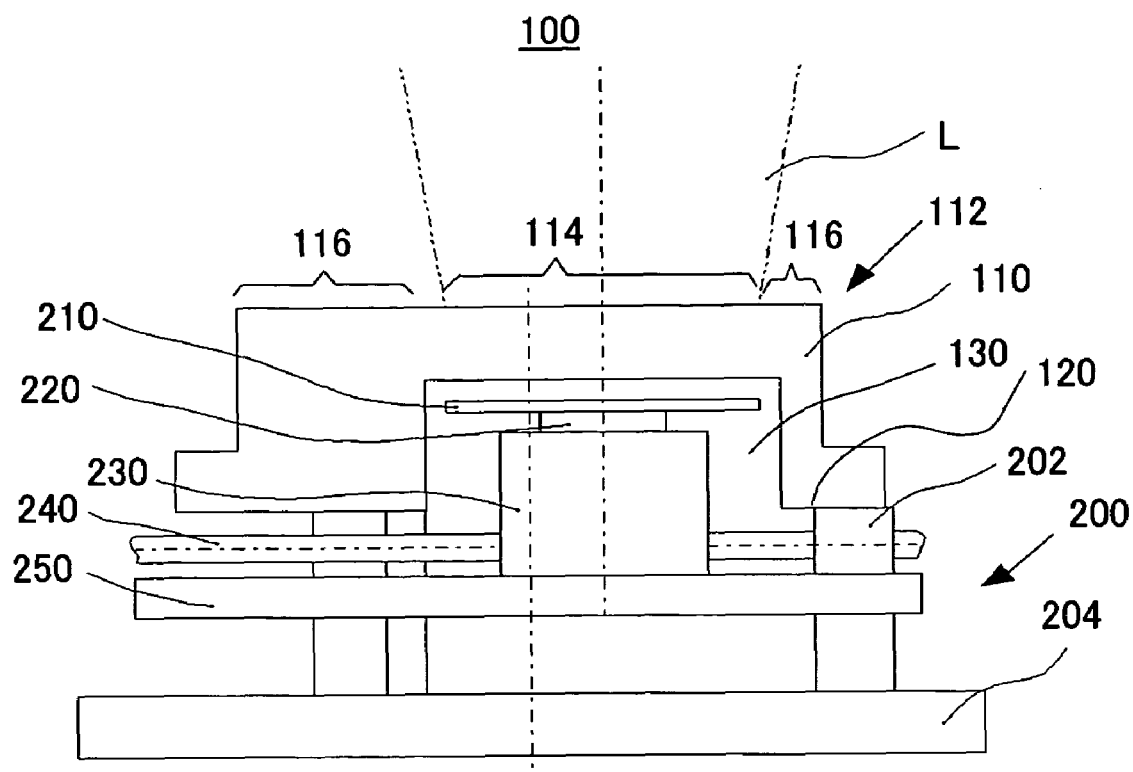
FIG. 1A is a schematic sectional view of an optical element of a first embodiment according to the present invention.
Figure 1B:
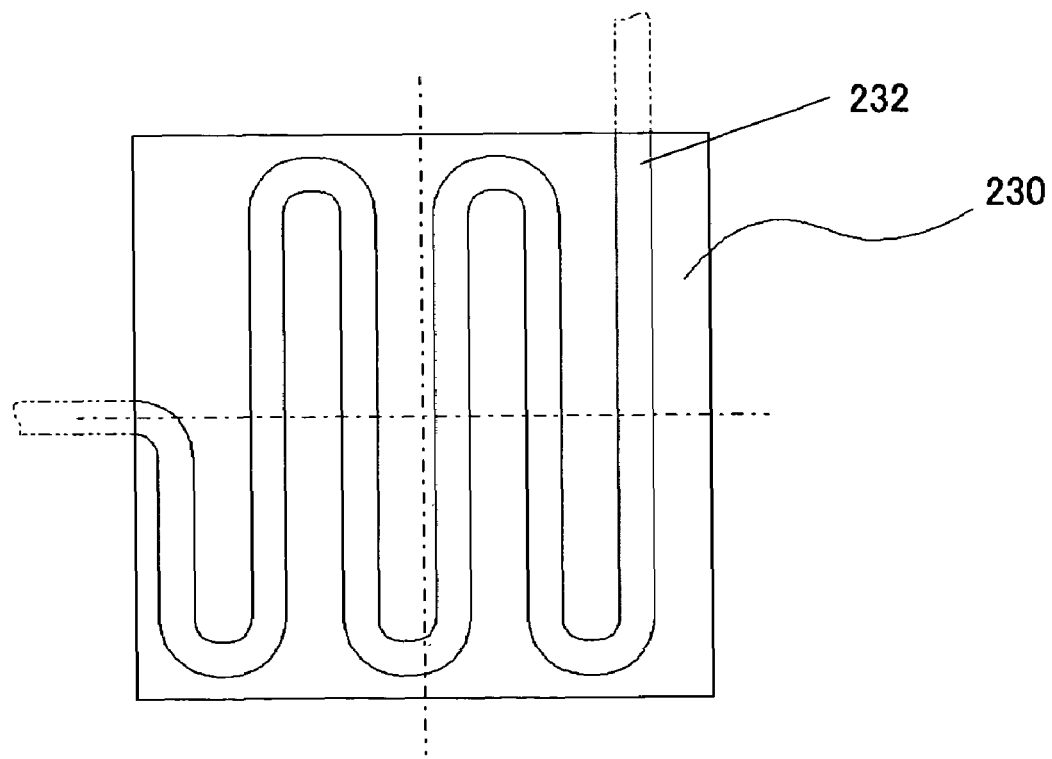
FIG. 1B is a schematic sectional view of a cooling jacket in a cooling apparatus shown in FIG. 1A.
Figure 2:
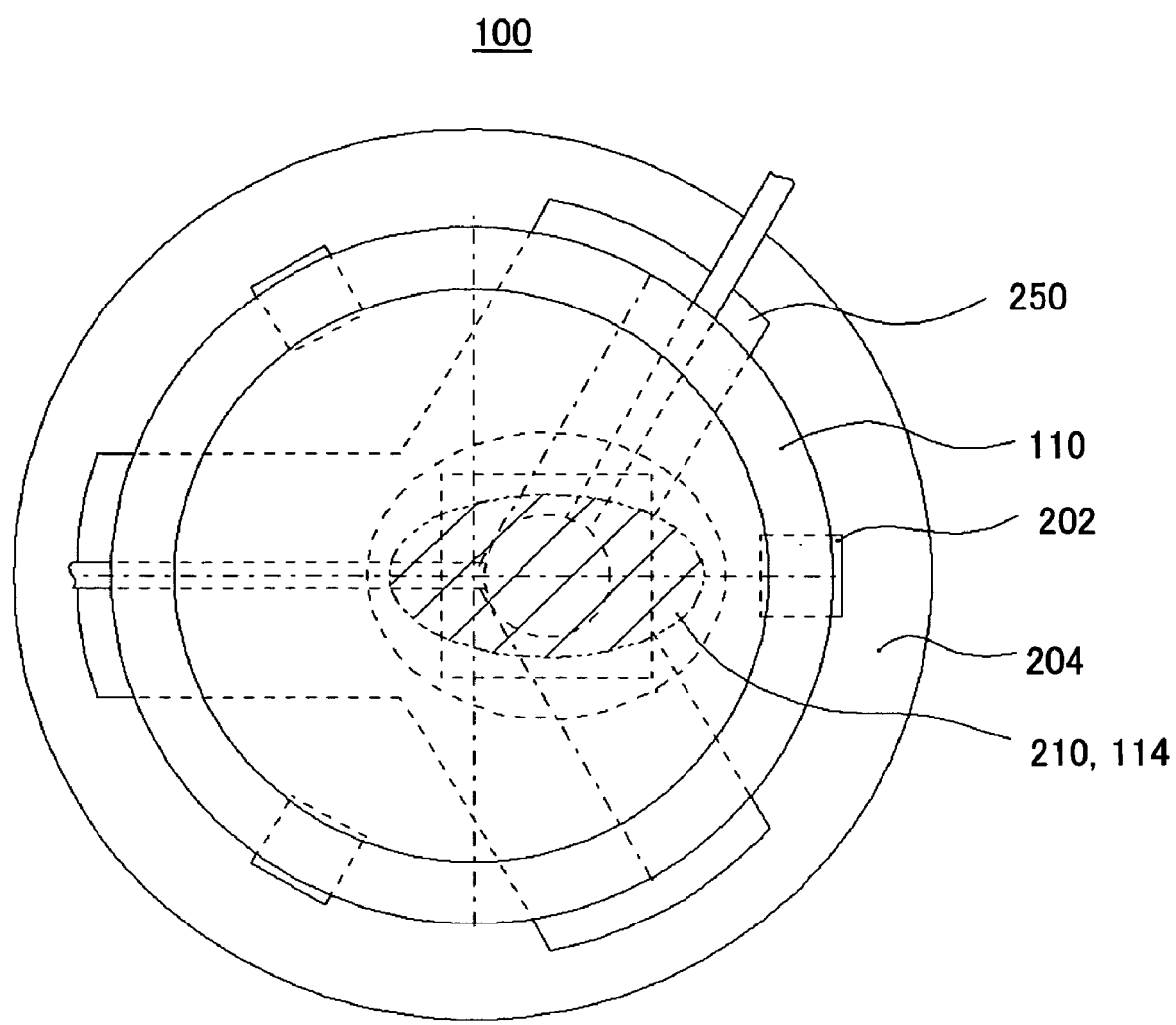
FIG. 2 is a transparent plane view of the optical element shown in FIG. 1A.

Referring now to FIGS. 1 and 2, a description will be given of a cooling apparatus 200 and an optical element 100 having the same. Here, FIG. 1A is a schematic sectional view of the optical element 100. FIG. 1B is a schematic sectional view of a cooling jacket 230 in the cooling apparatus 200. The optical element 100 in the instant embodiment includes a base 110 that serves as a mirror, and a cooling apparatus 200 that cools the base 110 through radiation in a non-contact manner. While the instant embodiment arranges the optical element 100 in a vacuum or reduced pressure atmosphere, the present invention does not limit the environment for the optical element 100.

The base 110 includes a front surface to be illuminated 112, and a rear surface 120 opposite to it. The surface 112 includes an area to be illuminated 114, and a non-illuminated area 116, and light L enters the area 114. A concave part 130 is formed in the rear surface 120 corresponding to the area 114, and accommodates a cooling apparatus 200. The base 110 serves as a mirror and uses a material of low thermal expansion, such as Shott Co.'s Zerodur and Corning Co.' ULE, so as to reduce influence of mirror's thermal expansions.

The cooling apparatus 200 includes a holder 202, a support plate 204, a radiation plate 210, a Peltier element 220, a cooling jacket 230, a pipe 240, and a support plate 250. As long as the cooling apparatus 200 cools the base 110 through radiation, the present invention does not limit structures of the Peltier element 220 and the cooling jacket 230.

The holder 202 holds the base 110. The support plate 204 is connected to the holder 202 and supports the mirror's weight. The radiation plate 210 is made of a material having good thermal conductivity and emissivity, such as ceramic and a metal material, and surface-treated so that its surface is roughened for enhanced emissivity. The bottom surface of the concave part 130 opposite to the radiation plate 204 is also processed to improve radiation, similar to the radiation plate.

The Peltier element 220 cools the radiation plate 210, and is fused onto the radiation plate 210 through a metallization treatment to the surface of the radiation plate 210. The cooling jacket 230 serves as a heat exchange that cools the heated Peltier element 220. FIG. 1B shows an internal structure of the cooling jacket 230. As illustrated, provided inside the cooling jacket 230 is a channel 232 that does not transmit fluid's pulsations, such as whirlpools. The Peltier element 220 is also fused onto the cooling jacket 230 through a treatment similar to the radiation plate 210.

The pipe 240 is to cool the cooling jacket 230, and connected to the channel 232 in the cooling jacket 230. The fluid supplied to the pipe 240 is water and other coolant suitable for heat exchange. A heat insulator is wound around the surface of the pipe 240 to prevent radiation from the pipe 240.

The support plate 250 supports a cooling structure that includes the radiation plate 210, the Peltier element 220, the cooling jacket 230, and the pipe 240. The support plate 250 and 204 are supported by different structures, respectively, such as a mirror barrel (not shown).

FIG. 2 is a transmission plane view of the optical element 100, and a beveled portion indicates the radiation plate 210 and the area 114. The radiation plate 210 can obtain radiation effects when it is larger than the area 114.

The light L, such as exposure light, is incident upon the surface 112 on the base 110, and heats the surface 112 according to its optical energy. The heat transmits to the bottom of the concave part 130 through a thermal conduction of the inside of the base 110. The radiation plate 210 has been cooled so that the Peltier element 220 can absorb the pre-calculated heat corresponding to the incident energy.

A rear surface of the Peltier element 220 heats up due to its element characteristics. The cooling jacket 230 can structurally absorb the heat from the Peltier element 220 by flowing water etc. through the pipe 240. In this case, the Peltier element 220 heats up in cooling the radiation plate 210, and the heat amount can be calculated in advance. The above structure cools the concave part 130 in the base 110, and prevents of the thermal deformation of the surface 112.

As discussed, the concave part 130 as the hollow rear surface 120 of the mirror base 110 accommodates the cooling apparatus 200, and improves the cooling efficiency even when a material having a low thermal conductivity is used for the base 110 because of a narrow interval between the surface 112 and the bottom surface of the concave part 130.

The cooling apparatus 200 arranged inside the base 110 cools only the base. For example, the conventional cooling apparatus 200 would possibly cool a mirror holder through radiation and thermally deform the holder, but the instant embodiment does not raise such a problem.

Figure 3:
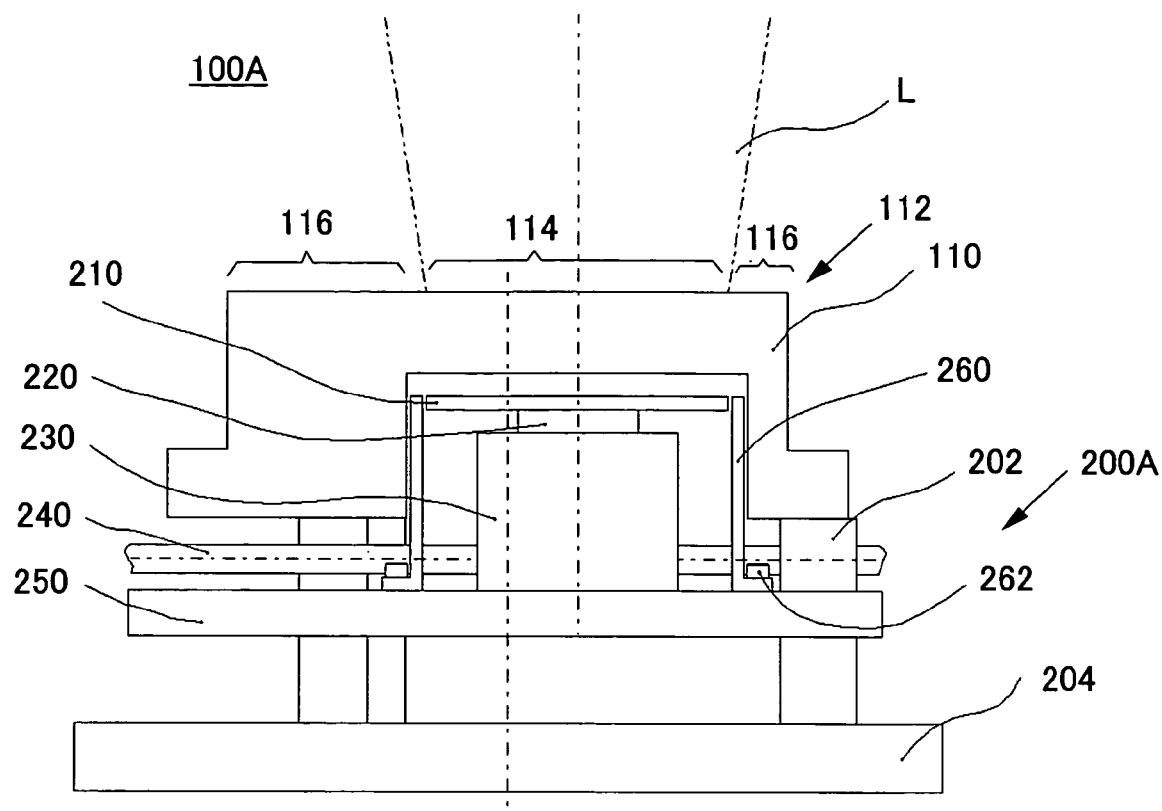
FIG. 3 is a schematic sectional view of an optical element of a second embodiment according to the present invention.

Referring now to FIG. 3, a description will be given of an optical element 100A of a second embodiment according to the present invention. Here, FIG. 3 is a schematic sectional view of the optical element 100A. The optical element 100A of the instant embodiment has a cooling apparatus 200A, which has a cover that limits a transmission of the heat, which has been emitted from the radiation plate 210 and the cooling jacket 230, to the bottom surface of the mirror's concave part. In FIG. 3, 260 is a heat insulation cover that shields the heat emitted from the bottom surface of the radiation plate 210 and the heat from the cooling jacket 230. 262 is a bolt that fixes the heat insulation cover 260 onto the support plate 250. The radiation plate 210 radiates the heat to the bottom surface of the concave part 130 in the base 110, and cools only that surface, preventing a deformation of the surface 112 caused by a deformed wall surface of the concave part 130.

Figure 4:
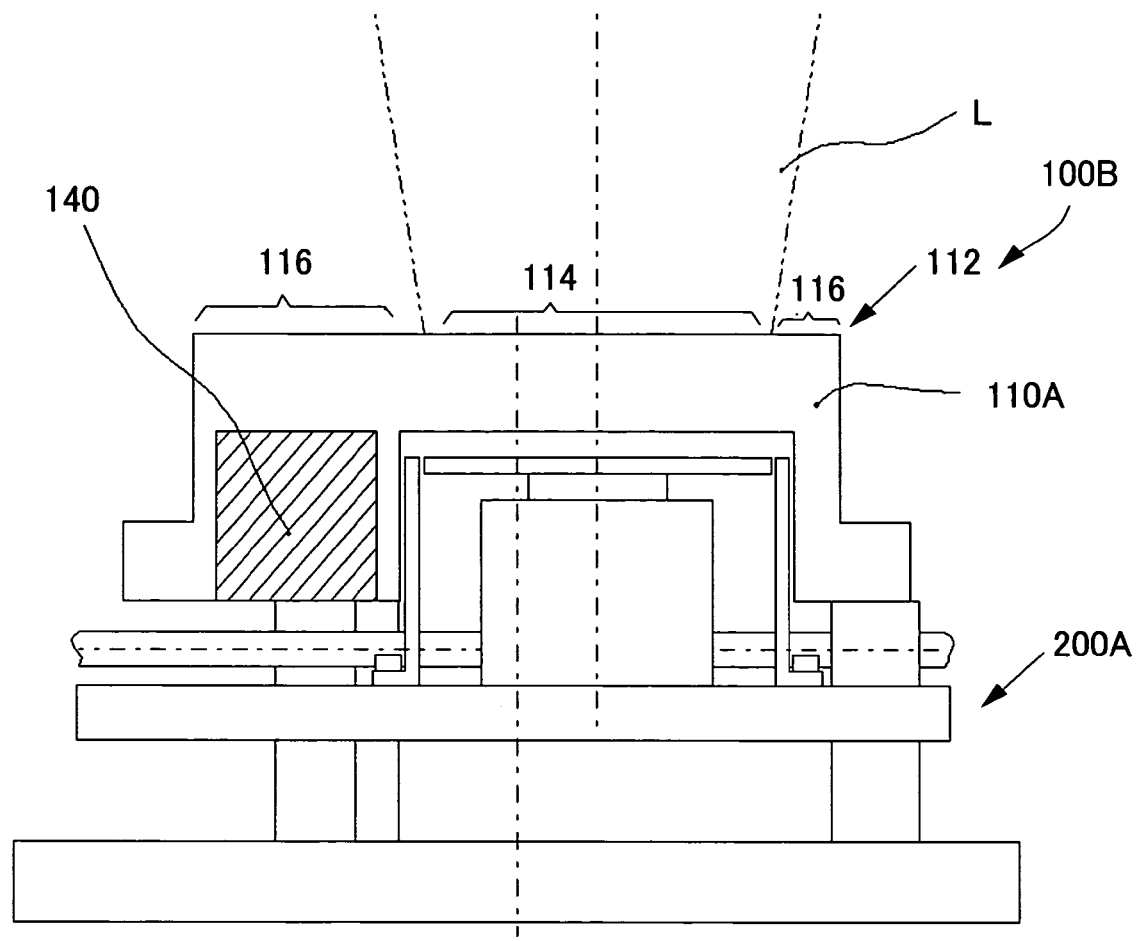
FIG. 4 is a schematic sectional view of an optical element of a third embodiment according to the present invention.
Figure 5:
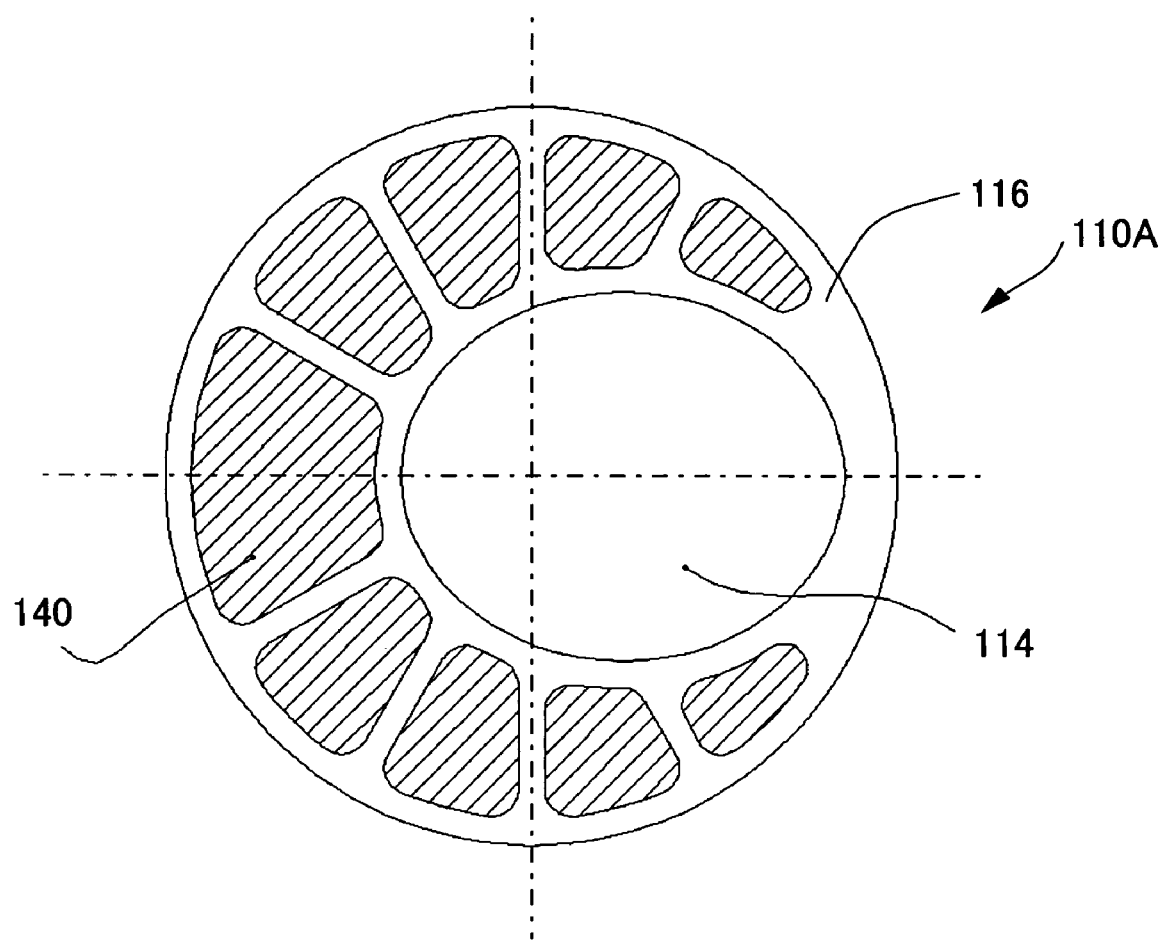
FIG. 5 is a partial transparent plane view of a base of the optical element shown in FIG. 4.

Referring now to FIGS. 4 and 5, a description will be given of an optical element 100B of a third embodiment according to the present invention. Here, FIG. 4 is a schematic sectional view of the optical element 100B. FIG. 5 is a partial transmission plane view of the base 110A of the optical element 100B. The optical element 100B in the instant embodiment includes the base 110A and the cooling apparatus 200A.

The base 110A is different from the base 110 in having a concave part 140 in addition to the concave part 130, and the concave part 140 is hatched in FIGS. 4 and 5. The concave part 140 is provided in the rear surface 120 opposite to the non-illuminated area 116 so as to enclose the area 114, and contributes to weight reduction of the base 110A. The concave part 140 needs to form its shape and depth by considering the entire rigidity of the base 110A, and may have a circular shape or a so-called egg crate shape. The instant embodiment differently forms shapes of plural concave parts 140 as shown in FIG. 5.

Figure 6:
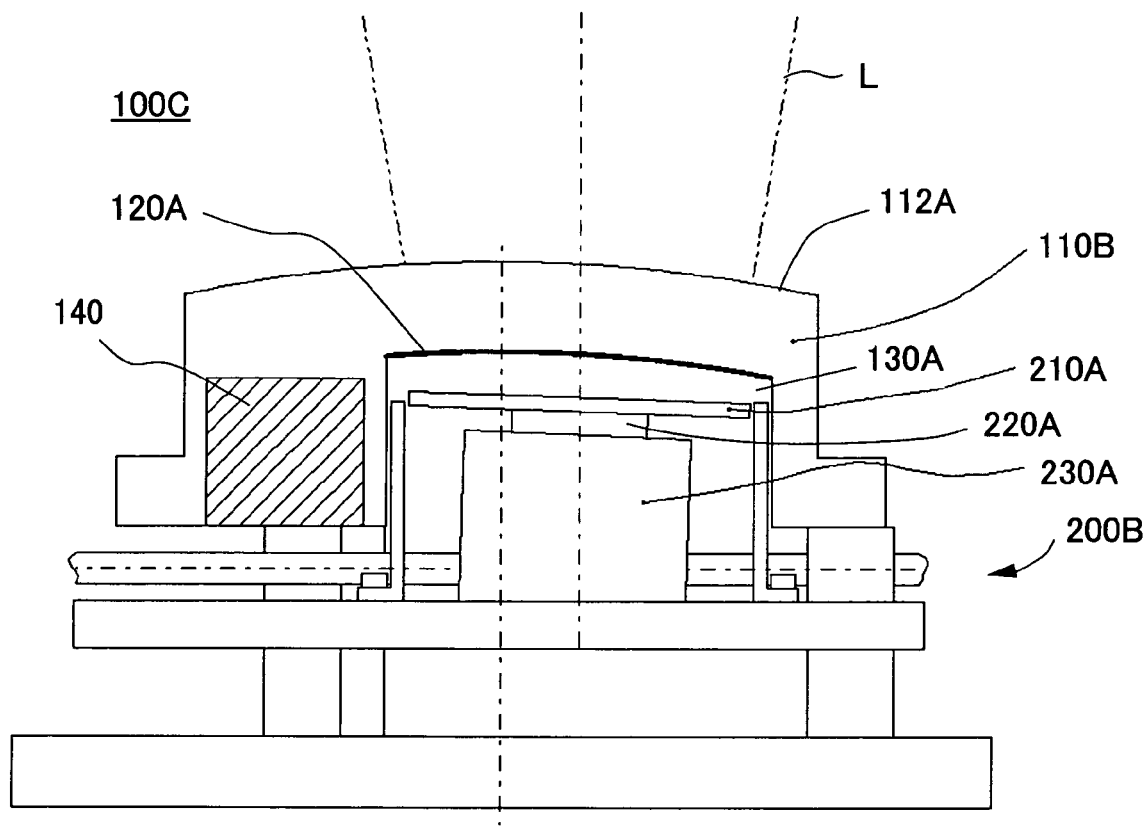
FIG. 6 is a schematic sectional view of an optical element of a fourth embodiment according to the present invention.

Referring now to FIG. 6, a description will be given of an optical element 100C of a fourth embodiment according to the present invention. Here, FIG. 6 is a schematic sectional view of the optical element 100C. The optical element 100C in the instant embodiment includes the base 110B and the cooling apparatus 200B.

The base 110B is different from the base 110A in that the surface 112A has a convex shape. In FIG. 6, the rear surface 120A in the concave part 130A so shaped as shown by a thick line that the concave part 130A has an approximately equal interval apart from the surface 112A throughout the surface 112A.

The cooling apparatus 200B forms the radiation plate 210A in a convex or approximately inclined shape to follow the shape of the convex part 130A. Accordingly, the Peltier element 220A and the cooling jacket 230A are formed in a convex or approximately inclined shape. Thus, when the concave part 130A in the base 110B has an approximately uniform temperature distribution, the surface 112A has a uniform conducted distribution. The instant embodiment parallelizes the radiation plate 210A to a hollow shape. However, strictly speaking, it is preferable to calculate a radiation form factor (which is a ratio by which energy emitted from one object reaches another object) between them, and to arrange them so as to maximize the radiation form factor. While FIG. 6 shows the convex surface 112, the surface 112 can be concave.

Figure 7:
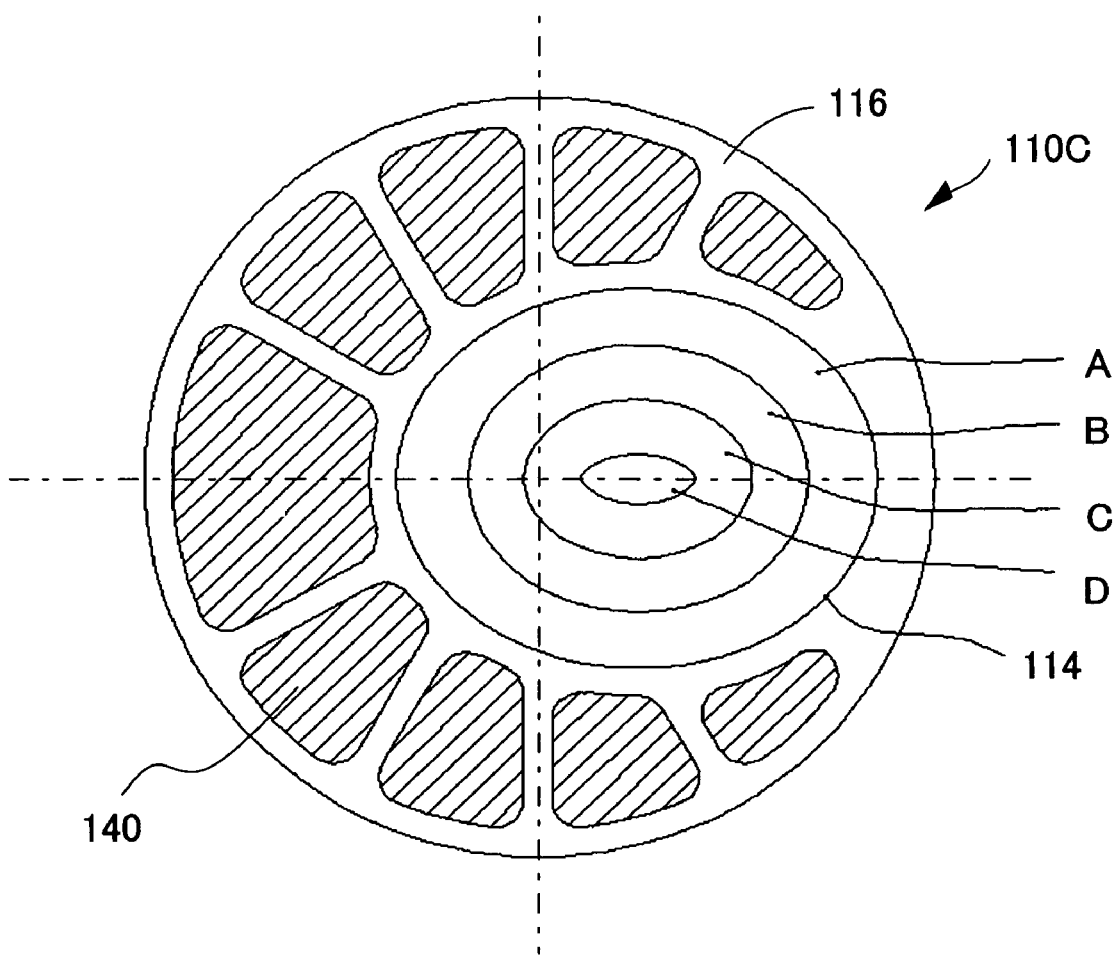
FIG. 7 is a partial transparent plane view of a base of an optical element of a fifth embodiment according to the present invention, and shows a temperature distribution on a surface to be illuminated.
Figure 8:
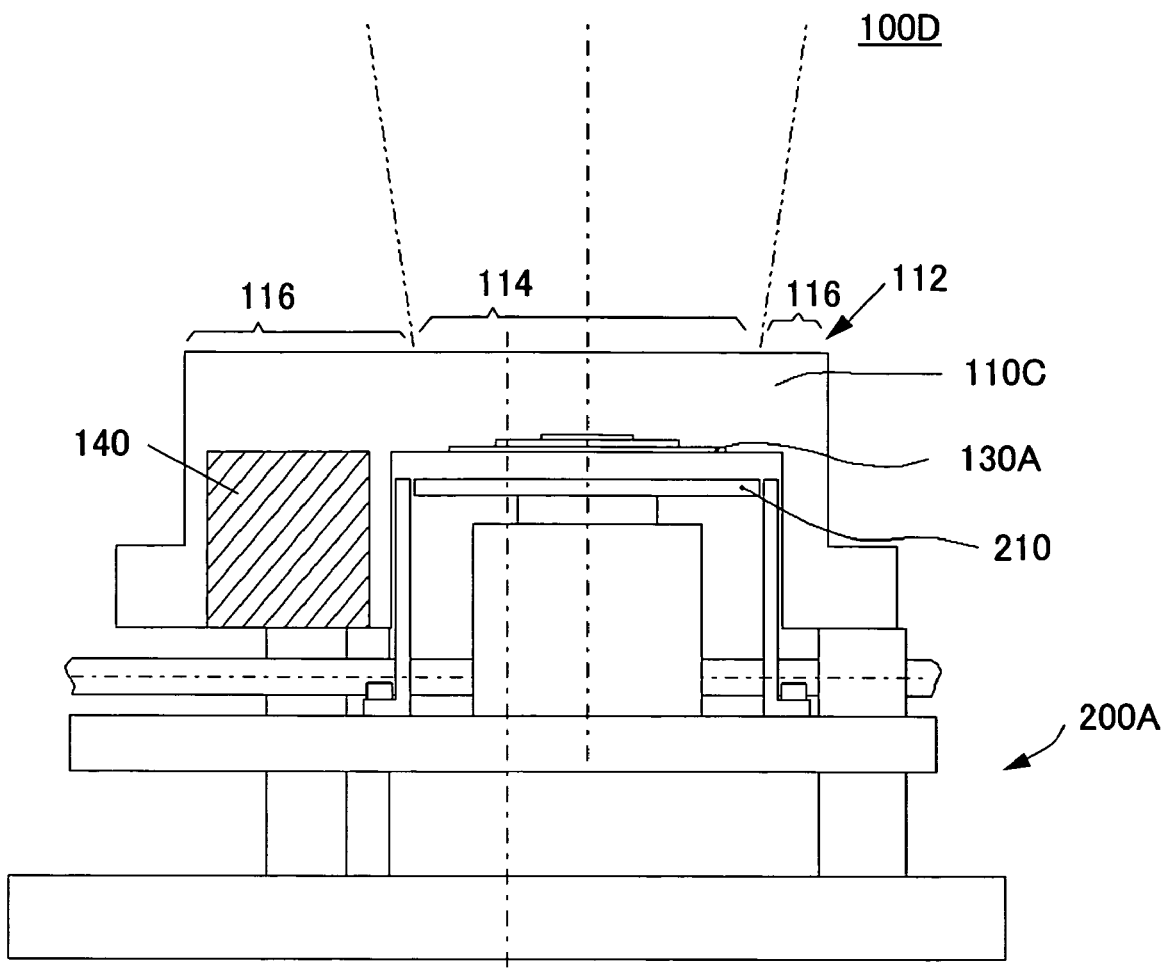
FIG. 8 is a schematic sectional view of the optical element shown in FIG. 7.

Referring now to FIGS. 7 and 8, a description will be given of an optical element 100D of a fifth embodiment according to the present invention. Here, FIG. 7 is a schematic sectional view of a base 110C of the optical element 100D. FIG. 8 is a partial transmission plane view of the optical element 100D. The optical element 100D in the instant embodiment includes the base 110C and the cooling apparatus 200A.

The base 110C is different from the base 110A in changing a shape of the concave part 130A according to a temperature distribution of the surface 112. As shown in FIG. 7, the area 114 produces temperature distributions A to D. Here, it is assumed that temperatures A to D have a relationship D>C>B>A. The concave part 130A is formed sectionally stepwise in the base 110C so as to eliminate influence of these temperature distributions. The concave part 130A is thick for a high temperature part, and thin for a low temperature part. A depth corresponding to the temperature distribution can be calculated so that the surface 112 does not produce a temperature distribution caused by the incident light. Although the instant embodiment forms a step concave part 130, the concave part 130 may have a smooth surface since the temperature distribution has generally a gradient. As a result, the area 114 in the optical element 100D does not form a temperature distribution.

The cooling power can be varied according to temperature distributions by changing a shape of the concave part 130 into the concave part 130A, changing a shape of the radiation plate 210 (for example, to make a high temperature portion (or a center part) close to the base 110), and changing the cooling power (for example, by enhancing cooling by the Peltier element 220 at the center part).

Figure 9:
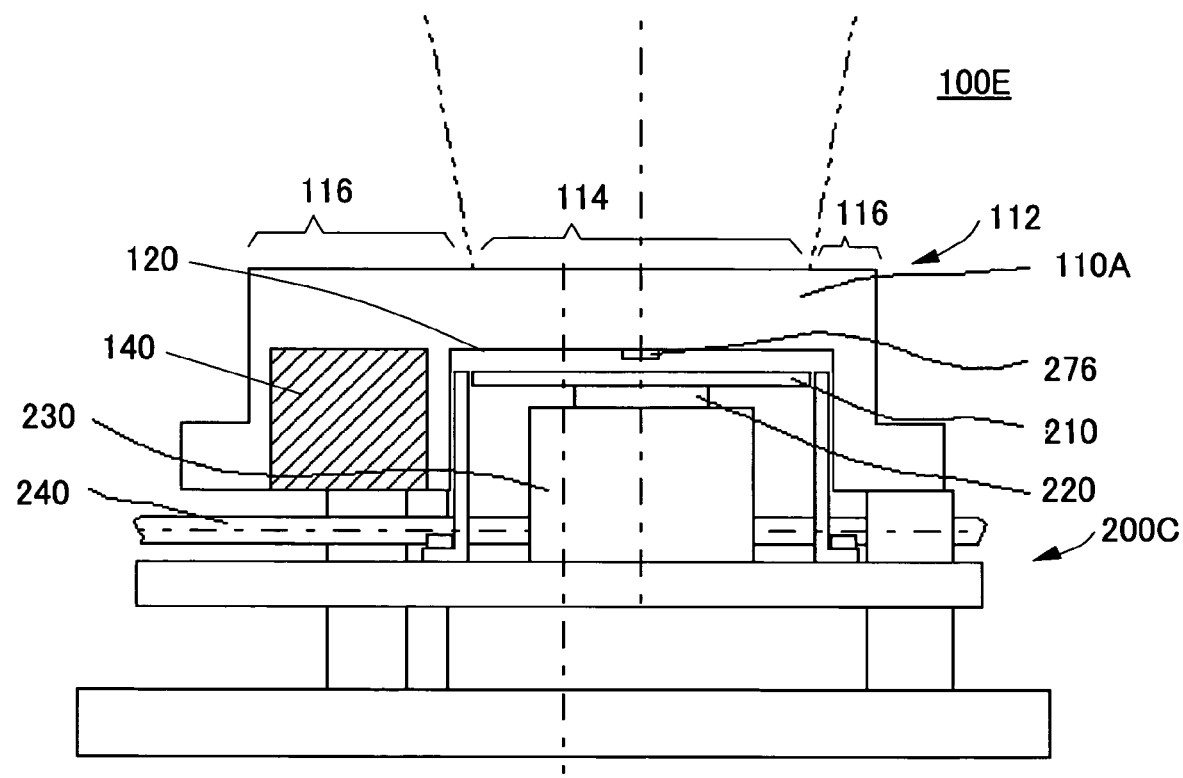
FIG. 9 is a schematic sectional view of an optical element of a sixth embodiment according to the present invention.

Referring now to FIGS. 9 and 10, a description will be given of an optical element 100E of a sixth embodiment according to the present invention. Here, FIG. 9 is a schematic sectional view of the optical element 100E. The optical element 100E in the instant embodiment includes the base 110A and the cooling apparatus 200C. The cooling apparatus 200C is different from the cooling apparatus 200A in having a temperature sensor 276. The temperature sensor 276 is provided on the rear surface 120 of the area 114 of the base 110A, and detects the (area 114's) temperature of the base 110A. Thereby, the temperature of the surface 112 is predictable. If necessary, plural temperature sensors 276 can be provided to measure the temperature distributions shown in FIG. 7.

Figure 10A:
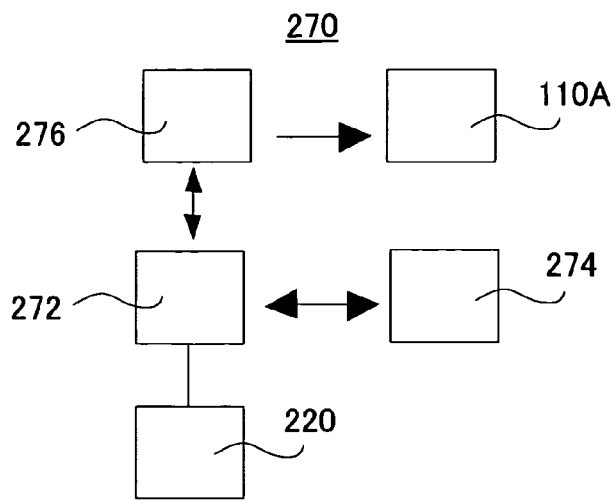
FIG. 10A is a block diagram of a temperature control system applicable to the optical element shown in FIG. 9.
Figure 10B:
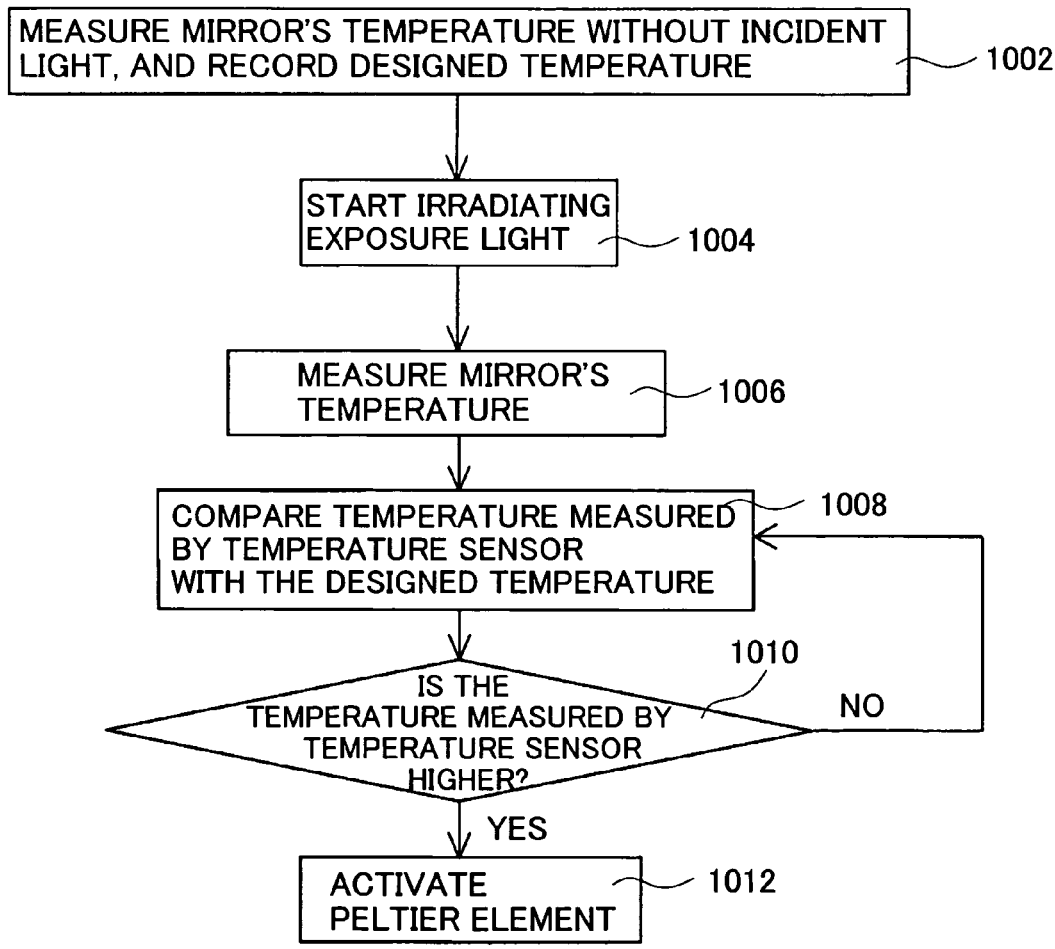
FIG. 10B is a flowchart of a temperature control method.

Referring now to FIG. 10, a description will be given of a temperature control system that uses the temperature sensor 276. Here, FIG. 10A is a block diagram of (a control system in) a temperature control system 270. FIG. 10B is a flowchart of a temperature control method.

The temperature control system 270 includes a controller 272, a memory 274, and a temperature sensor 276. The controller 272, irrespective of its name, such as a CPU and a MPU, serves to control the temperature of the base 110A. The memory 274 includes a RAM, a ROM, and a hard disc drive, etc., and stores a temperature control method shown in FIG. 10B and necessary values (such as an initial temperature and a designed temperature). As discussed, the temperature sensor 276 detects the temperature of the base 110A, and may use various types of temperature sensors.

A position of the temperature sensor 276 can be properly changed for design and control purposes. As discussed, the number of the temperature sensors can be variable according to mirror shapes. The temperature sensor 276 can be provided on the surface 112 of the base 110A to supplement the measurement of the rear surface 120 by the temperature sensor 276. The temperature sensor 276 can be arranged on the top surface of the radiation plate 210. Of course, the base 110A can be changed to any one of other bases 110, 110B and 110C.

Referring now to FIG. 10B, a description will be given of a temperature control method. First, the temperature sensor 276 measures the temperature of the base 110A while there is no incident light, and stores the designed temperature in the memory 274 (step 1002). Next follows irradiation of light, for example, exposure light (step 1004). Simultaneous with the light irradiation, the temperature sensor 276 measures the temperature of the base 110A (step 1006).

The controller 272 compares the temperature measured by the temperature sensor 276 with the designed temperature that has been stored in the memory 274 for the base 110A (step 1008). When the temperature measured by the temperature sensor 276 is higher, the Peltier element 220 is operated and the radiation plate 210 is cooled. The temperature sensor 276 always monitors the temperature cooled by the Peltier element 220, and sends the value to the controller 272 to control the Peltier element 220. When temperature measured by the temperature sensor 276 is lower, the controller 272 stops the Peltier element 220. During the above operation, fluid, such as water, for absorbing the heat of the Peltier element 220 is flowed through the cooling jacket 230.

Since the temperature sensor 276 always monitors the temperature rise associated with the incident exposure light L, the temperature-caused deformations of the surface 112 can be prevented in a real-time basis.

Figure 11:
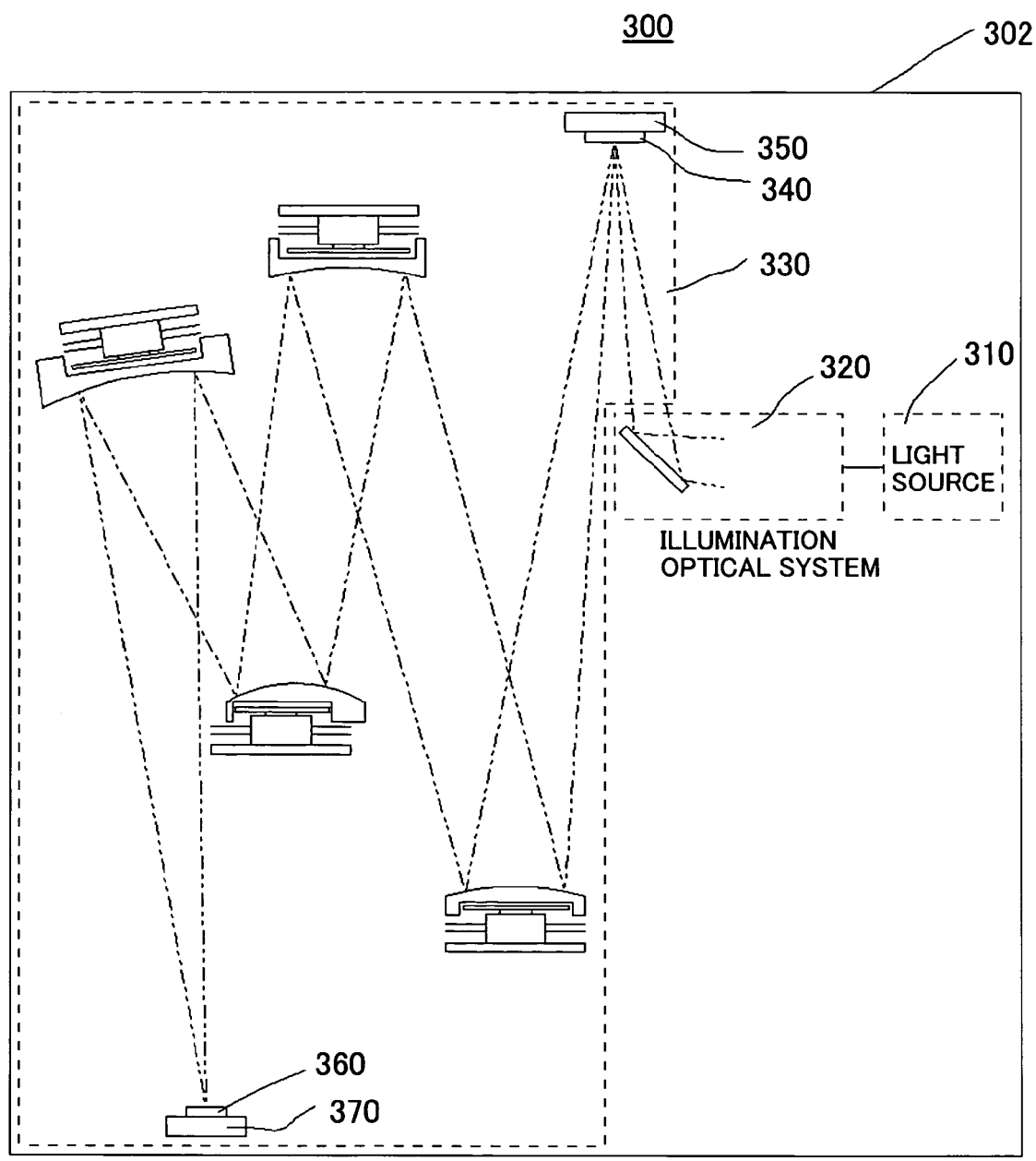
FIG. 11 is a simplified optical-path view of an exposure apparatus of one embodiment according to the present invention.

Referring now to FIG. 11, a description will be given of an exposure apparatus 300 of one embodiment according to the present invention. Here, FIG. 11 shows a simplified optical-path diagram of the exposure apparatus 300. The exposure apparatus 300 uses, as illumination light for exposure, EUV light (with a wavelength of, e.g., 13.4 nm) to exposes onto an object a circuit pattern formed on a mask 340, for example, in a step-and-repeat manner and step-and-scan manner.

The exposure apparatus 300 is suitable for a lithography process of a submicron or a quarter-micron or less, and thus a description will be given of a step-and-scan type exposure apparatus as an example in this embodiment. Here, the "step-and-scan manner" is one mode of exposure method that moves a wafer stepwise to an exposure area for the next shot every shot of cell projection onto the wafer.

In FIG. 11, 302 is a vacuum chamber for accommodating and maintaining an optical system in a reduced pressure or vacuum atmosphere, such as about $1 \times 10^{-6}$ Pa, since the EUV light reacts with residual gas, such as carbon hydride, etc., in the air, causes contaminations, and lowers the reflectance of the mirror surface. 310 is a light source that uses, for example, a laser plasma light source. The laser plasma light source irradiates a highly intensified pulse laser beam to a target material put in vacuum, thus generating high-temperature plasma for use as EUV light with a wavelength of about 13 nm emitted from this.

320 is an illumination optical system that uniformly illuminate a mask 340, which will be described later, with the EUV light emitted from the light source 310, and includes some mirrors and an aperture that limits the illuminated area to an arc shape. The optical element having the cooling apparatus of the instant embodiment is applicable to the illumination optical system 320. Use of the optical element of the instant embodiment would be able to eliminate or reduce deformations of the mirror surface and provide excellent imaging performance.

330 is a projection optical system that uses some mirrors to project a reduced size of a pattern on the mask 340 surface onto the wafer 360 surface as an image surface. The projection optical system 340 includes four to six mirrors. As illustrated, the cooling structure 250 is provided on the rear surface of the mirror. As discussed, the cooling structure 250 is supported by the support plate 204 so that vibrations generated in the cooling structure 250 do not transmit the mirror surface. A hollow rear surface opposite to the mirror's illuminated surface can reduce the thermal conduction time in the mirror, and improve the cooling effect.

340 is a reflection mask that forms a circuit pattern or image to be transferred. The mask 340 is supported by a mask stage 350, which will be described later, and arranged at a position optically conjugate with a wafer 360, which will be described later.

350 is a mask stage that supports the mask 340, and is connected to a moving mechanism (not shown), such as a linear motor. The linear motor synchronously scans the mask 340 and the wafer 360. An alignment detection mechanism (not shown) drives the mask stage 350 to a proper position. The alignment detection mechanism measures a positional relationship between a position of the mask 340 and the optical axis of the projection optical system 330, and a positional relationship between a position of the wafer 360 and the optical axis of the projection optical system 330, and sets positions and angles of the mask stage 350 and the wafer stage 370, which will be described later, so that the projected image accords with a predetermined position of the wafer 360.

360 is an object to be exposed, which is a wafer in the instant embodiment, but broadly covers a LCD and other objects. Photoresist is applied to the object 360. A photoresist application step includes a pretreatment, an adhesion accelerator application treatment, a photo-resist application treatment, and a pre-bake treatment. The pretreatment includes cleaning, drying, etc. The adhesion accelerator application treatment is a surface reforming process so as to enhance the adhesion between the photoresist and a base (i.e., a process to increase the hydrophobicity by applying a surface active agent), through a coat or vaporous process using an organic film such as HMDS (Hexamethyl-disilazane). The pre-bake treatment is a baking (or burning) step, softer than that after development, which removes the solvent.

370 is a wafer stage that supports the wafer 360 via a wafer chuck (not shown). For example, the wafer stage 370 uses, for example, a linear motor, to move the wafer 360 in a scan direction (X direction hereinafter), a direction orthogonal to the scan direction (Y direction hereinafter), and a normal direction of the object 360 surface (Z direction hereinafter). As discussed, the object 360 moves in synchronization with the mask 340. A focus detection mechanism (not shown) operates the wafer stage 370. The focus detection mechanism measures a focus position of the object 360 surface in the Z direction, and always maintains the object 360 surface at an imaging position of the projection optical system 330 by controlling the position and angle of the wafer stage 370.

Thus, the instant cooling structure is applied to the exposure apparatus. The inventive cooling structure does not necessarily require the EUV light, and is compatible with excimer laser beams and applicable to the mask and wafer.

The optical element 100 of the instant embodiment 100 uses the hollow rear surface 120 opposite to the surface 112 to shorten the distance between the surface 112 and the rear surface 120, and is cooled in a non-contact manner. This structure reduces the thermal expansion of the optical element 100, and realizes the desired optical performance.

While the instant embodiment refers to cooling, the instant embodiment is applicable to temperature control over an optical element.

Figure 12:
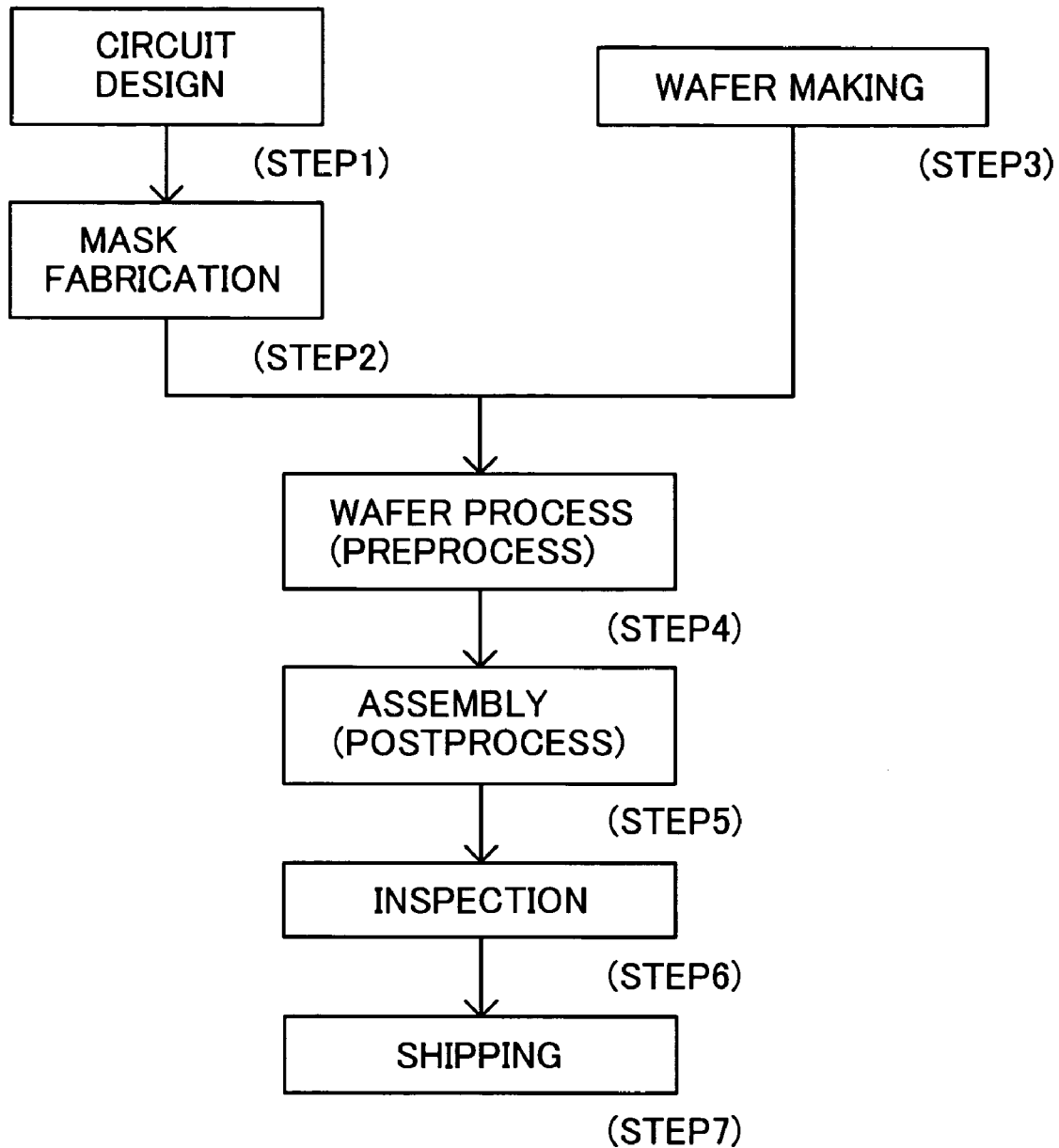
FIG. 12 is a flowchart for explaining a method for fabricating devices (semiconductor chips such as ICs, LSIs, and the like, LCDs, CCDs, etc.).
Figure 13:
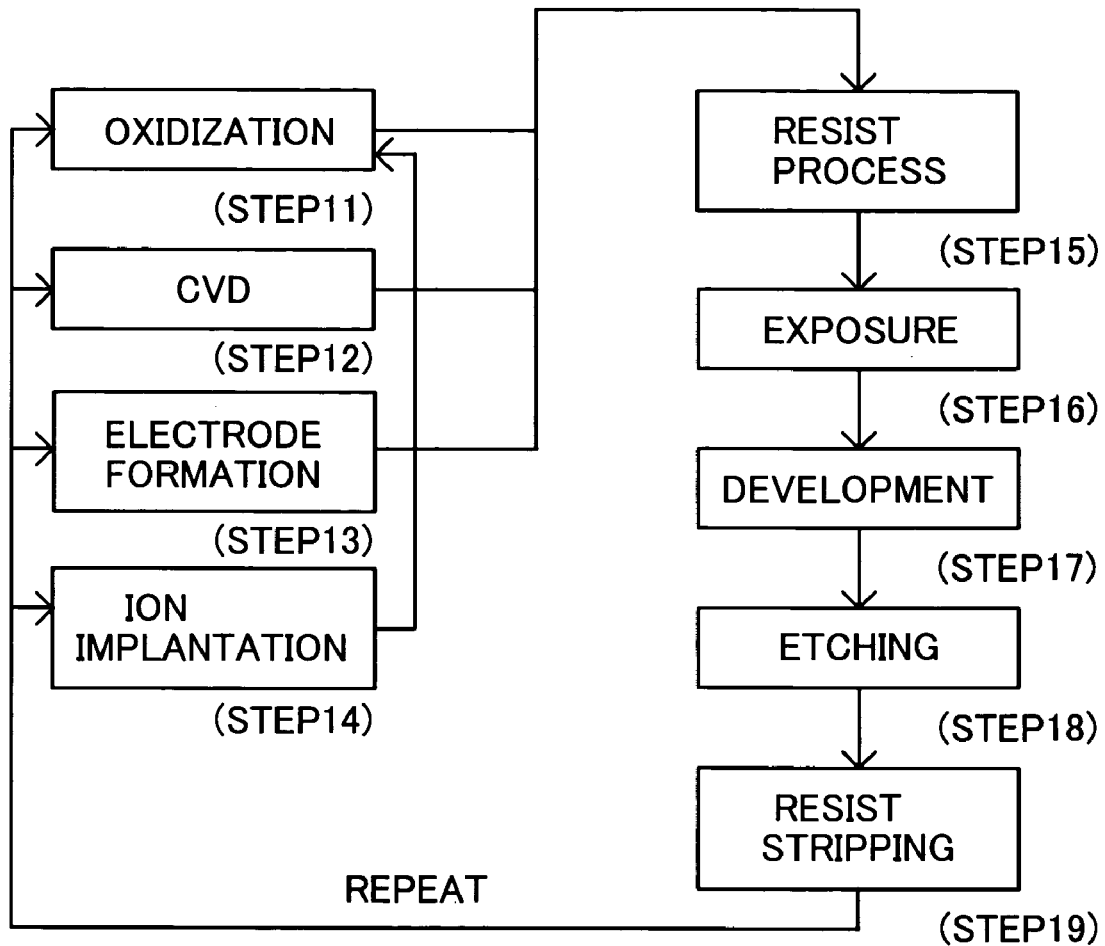
FIG. 13 is a detailed flowchart for Step 4 of wafer process shown in FIG. 12.

Referring to FIGS. 12 and 13, a description will now be given of an embodiment of a device fabricating method using the above exposure apparatus 300. FIG. 12 is a flowchart for explaining a fabrication of devices (i.e., semiconductor chips such as IC and LSI, LCDs, CCDs, etc.).

Here, a description will be given of a fabrication of a semiconductor chip as an example. Step 1 (circuit design) designs a semiconductor device circuit. Step 2 (mask fabrication) forms a mask having a designed circuit pattern. Step 3 (wafer preparation) manufactures a wafer using materials such as silicon. Step 4 (wafer process), which is referred to as a pretreatment, forms actual circuitry on the wafer through photolithography using the mask and wafer. Step 5 (assembly), which is also referred to as a posttreatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 13 is a detailed flowchart of the wafer process in Step 4. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ion into the wafer. Step 15 (resist process) applies a photosensitive material onto the wafer. Step 16 (exposure) uses the exposure apparatus 300 to expose a circuit pattern on the mask onto the wafer. Step 17 (development) develops the exposed wafer. Step 18 (etching) etches parts other than a developed resist image. Step 19 (resist stripping) removes disused resist after etching. These steps are repeated, and multilayer circuit patterns are formed on the wafer.

As discussed, the present invention can provide a cooling apparatus that prevents or reduces a deformation of an optical element for desired optical performance, the optical element having the cooling apparatus, and an exposure apparatus that uses the optical element.

What is claimed is:

1. An optical element comprising:
   a base having a reflecting surface to be illuminated by light, and a rear surface opposite to the reflecting surface, wherein the rear surface includes a first part defined by a cut-out portion and a second part not defined by a cut-out portion; and
   a cooling mechanism for cooling said base through radiation in non-contacted manner, wherein the cooling mechanism includes a radiation plate accommodated by the cut-out portion and a Peltier element that cools the radiation plate.

2. An optical element according to claim 1, wherein the reflecting surface has an illuminated area and a non-illuminated area, and the first part is located opposite to the illuminated area and the second area is located opposite to the non-illuminated area.

3. An optical element according to claim 1, wherein said cooling mechanism has a channel for coolant to flow, and further includes a cooling jacket for recovering heat from the Peltier element.

4. An optical element according to claim 1, wherein said cooling mechanism further includes a heat insulator for preventing the base from absorbing heat obtained by the cut-out portion.

5. An optical element according to claim 2, wherein the cut-out portion has a shape that changes according to temperature distributions on the reflecting surface.

6. An optical element according to claim 2, wherein the cooling mechanism changes cooling power based on a position according to temperature distributions on the reflecting surface.

7. An optical element according to claim 1, further comprising a mirror.

8. An optical element according to claim 1, further comprising:
   a detector for detecting a temperature of said base; and
   a controller for controlling said cooling mechanism so that the temperature of said base detected by said detector becomes a predetermined value.

9. An exposure apparatus comprising an optical system for exposing a pattern formed on a mask or a reticle onto an object, wherein said optical system includes an optical element, and the optical element includes a base having a reflecting surface to be illuminated by light, and a rear surface opposite to the reflecting surface, wherein the rear surface includes a first part defined by a cut-out portion and a second part not defined by a cut-out portion, and a cooling mechanism for cooling said base through radiation in a non-contact manner, wherein the cooling mechanism includes a radiation plate accommodated by the cut-out portion and a Peltier element that cools the radiation plate.

10. A device fabricating method comprising the steps of:
    exposing a pattern on a mask or a reticle onto an object using an exposure apparatus that includes an optical system, wherein said optical system includes an optical element, and the optical element includes a base having a reflecting surface to be illuminated by light, and a rear surface opposite to the reflecting surface, wherein the rear surface includes a first part defined by a cut-out portion and a second part not defined by a cut-out portion, and a cooling mechanism for cooling said base through radiation in a non-contact manner, wherein the cooling mechanism includes a radiation plate accommodated by the cut-out portion and a Peltier element that cools the radiation plate; and
    developing the exposed object.

* * * * *